(12) United States Patent
Pal (10) Patent No.: US 9,680,080 B2
(45) Date of Patent: Jun. 13, 2017

(54) THERMOELECTRIC CONVERSION OF WASTE HEAT FROM GENERATOR COOLING SYSTEM

(75) Inventor: Debabrata Pal, Hoffman Estates, IL (US)

(73) Assignee: Hamilton Sunstrand Corporation, Windsor Locks, CT (US)

( * ) Notice: Subject to any disclaimer, the term of this patent is extended or adjusted under 35 U.S.C. 154(b) by 1416 days.

(21) Appl. No.: 13/184,686

(22) Filed: Jul. 18, 2011

(65) Prior Publication Data

US 2013/0019917 A1  Jan. 24, 2013

(51) Int. Cl.
| H02K 9/00 | (2006.01) |
| H01L 35/34 | (2006.01) |
| H01L 35/30 | (2006.01) |
| H02K 9/19 | (2006.01) |
| H02K 11/00 | (2016.01) |
| H02K 7/18 | (2006.01) |

(52) U.S. Cl.
CPC ............ H01L 35/30 (2013.01); H02K 9/19 (2013.01); H02K 11/0094 (2013.01); H02K 7/18 (2013.01)

(58) Field of Classification Search
CPC ................................. H01L 35/32; H02K 9/02
USPC ................. 310/52, 54, 58; 136/224
See application file for complete search history.

(56) References Cited

U.S. PATENT DOCUMENTS

| 3,264,547 A * | 8/1966 | Carlson, Jr. ............... 363/13 |
| 3,899,359 A | 8/1975 | Stachurski |
| 7,254,953 B2 | 8/2007 | Callas et al. |
| 7,608,777 B2 | 10/2009 | Bell et al. |
| 7,658,070 B2 | 2/2010 | Wootton et al. |
| 2008/0083477 A1 | 4/2008 | Drillet et al. |
| 2008/0203596 A1* | 8/2008 | Okada .................. 264/40.6 |
| 2009/0159110 A1 | 6/2009 | Kwok et al. |
| 2010/0146990 A1* | 6/2010 | Taras ............... F04B 35/04 62/3.2 |
| 2010/0283334 A1 | 11/2010 | Lemmers, Jr. et al. |
| 2011/0258995 A1* | 10/2011 | Limbeck et al. ........ 60/320 |

FOREIGN PATENT DOCUMENTS

| DE | 102008057567 A1 * | 5/2010 |
| JP | 63144733 A * | 6/1988 |
| JP | 2007336670 A * | 12/2007 |
| RU | 2142667 C1 * | 12/1999 |

OTHER PUBLICATIONS

Machine Translation JP2007336670 (2007).*

* cited by examiner

*Primary Examiner* — Jose Gonzalez Quinones
(74) *Attorney, Agent, or Firm* — Kinney & Lange, P.A.

(57) ABSTRACT

An electrical generator includes a rotor, a stator core disposed axially around the rotor, a stator sleeve assembly disposed axially around the stator core, and a stator housing disposed axially around the stator sleeve assembly. The stator sleeve assembly includes a cylindrical stator sleeve and thermoelectric elements. The cylindrical stator sleeve has a radially inward facing surface and a radially outward facing surface. The thermoelectric elements are affixed to the radially outward facing surface of the cylindrical stator sleeve. The stator housing includes at least one coolant channel. The coolant channel is in thermal contact with the thermoelectric elements. The thermoelectric elements generate power as a function of the temperature difference between the cylindrical stator sleeve and the coolant channel.

12 Claims, 6 Drawing Sheets

THERMOELECTRIC CONVERSION OF WASTE HEAT FROM GENERATOR COOLING SYSTEM

BACKGROUND

The present invention relates to electrical generators. In particular, the invention relates to fluid-cooled electrical generators.

Electrical generators include a rotor core rotationally driving by a shaft connected through a gear box to a prime mover, such as a gas turbine engine. The rotor includes field coils and/or permanent magnets and rotates within a non-rotating outer shell, or stator core. The stator core includes coiled windings such that rotation of the rotor with energized field coils and/or permanent magnets induces an electric current in the stator windings, thus generating electricity. Inefficiencies in the process of converting mechanical power to electrical power produce significant waste heat which must be removed for the generator for the generator to operate continuously. Typically, a cooling fluid, for example air or oil, flows through channels in a stator housing surrounding the stator to absorb the waste heat and carry it from the generator. The cooling fluid, having absorbed the waste heat, flows in a circuit to a heat exchanger and back to the generator. In the heat exchanger, the cooling fluid is cooled by conduction of the waste heat to a second cooling fluid before completing the circuit back to the generator. While a portion of the waste heat may be beneficially employed by the second cooling fluid if heating the second fluid improves its utility, the bulk of the waste heat is eventually absorbed by the ambient environment and is wasted.

SUMMARY

One embodiment of the present invention is an electrical generator including a rotor, a stator core disposed axially around the rotor, a stator sleeve assembly disposed axially around the stator core, and a stator housing disposed axially around the stator sleeve assembly. The stator sleeve assembly includes a cylindrical stator sleeve and thermoelectric elements. The cylindrical stator sleeve has a radially inward facing surface and a radially outward facing surface. The thermoelectric elements are affixed to the radially outward facing surface of the cylindrical stator sleeve. The stator housing includes at least one coolant channel. The coolant channel is in thermal contact with the thermoelectric elements. The thermoelectric elements generate power as a function of the temperature difference between the cylindrical stator sleeve and the coolant channel.

DETAILED DESCRIPTION

The present invention is an electrical generator cooling system that employs thermoelectric devices to convert waste heat to useful electrical power. The electrical generator features a stator sleeve assembly that includes thermoelectric elements affixed to the outer surface of a stator sleeve. The stator sleeve is disposed axially around the stator core. Waste heat generated in the stator core, and in stator windings within the stator core, is removed by conduction through the stator sleeve assembly to cooling fluid flowing in coolant channels in a stator housing that surrounds the stator sleeve assembly. The thermoelectric elements generate useful electrical power from the conduction of waste heat from the stator core, through the stator sleeve, across the thermoelectric elements, and into cooling fluid flowing through the coolant channels. Positioning the thermoelectric elements on the outer surface of the stator sleeve provides the thermoelectric elements with one of the largest temperature differences available in the generator cooling system, resulting in more effective conversion of waste heat to useful electrical power.

In some embodiments, the cooling fluid, having absorbed the waste heat, flows in a circuit to a heat exchanger and back to the generator. In the heat exchanger, the cooling fluid is cooled by conduction of the waste heat to a second cooling fluid before completing the circuit back to the generator. By employing a second set of thermoelectric elements within the heat exchanger between the cooling fluid from the generator and the second cooling fluid, additional useful electrical power may be generated by the temperature difference between the cooling fluid from the generator and the second cooling fluid. The second set of thermoelectric elements within the heat exchanger complements the thermoelectric elements of the stator sleeve assembly to convert waste heat from the electrical generator into useful electrical power.

Figure 1:
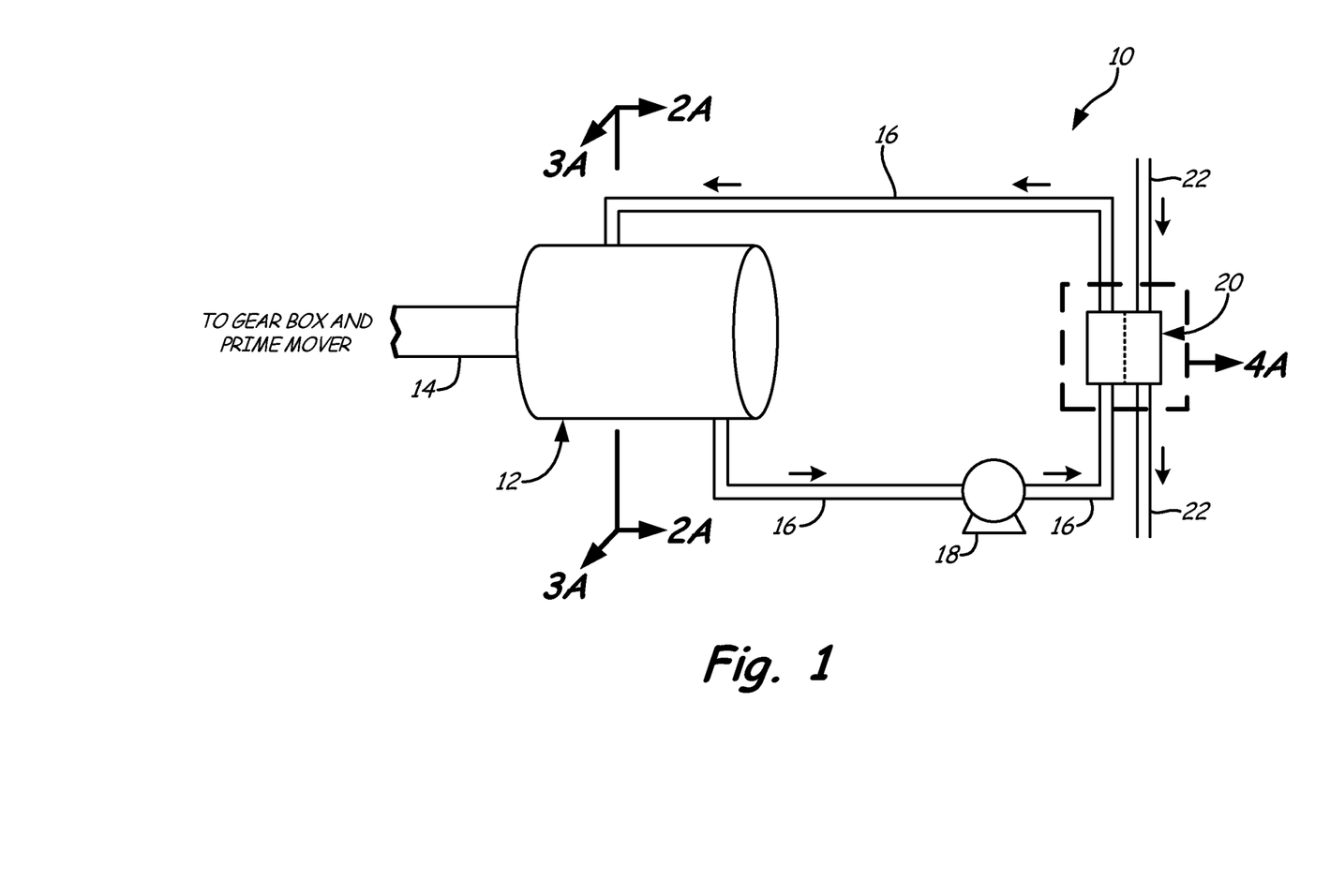
FIG. 1 is a representative diagram of electrical generator with an external cooling system comprising an embodiment of the present invention for thermoelectric conversion of waste heat.

FIG. 1 is a representative diagram of an electrical generator with an external cooling system comprising an embodiment of the present invention for thermoelectric conversion of waste heat. FIG. 1 shows electrical generator with external cooling system 10 which includes electrical generator 12, shaft 14, first coolant flow path 16, pump 18, heat exchanger 20, and second cooling flow path 22. Electrical generator 12 is connected to shaft 14 with shaft 14 providing rotation from a prime mover (not shown), for example, a gas turbine engine, by way of a gear box (not shown). First coolant flow path 16 is connected to electrical generator 12 and heat exchanger 20 to form a circuit between electrical generator 12 and heat exchanger 20. Pump 18 is connected along first coolant flow path 16. As illustrated, pump 18 is connected downstream of electrical generator 12, but it is understood that pump 18 may be connected anywhere along first coolant flow path 16. Second coolant flow path 22 is connected to heat exchanger 20.

In operation, shaft 14, rotated by the prime mover by way of the gear box, causes electrical power to be generated by electrical generator 12. The conversion of mechanical power to electrical power produces waste heat within electrical generator 12. First coolant flow path 16 provides a first cooling fluid, for example, helium, air, oil, water, or a glycol/water mixture, to electrical generator 12. Waste heat is transferred from electrical generator 12 to the first cooling fluid provided by first coolant flow path 16. Pump 18 moves the first cooling fluid containing the waste heat out of electrical generator 12, through first coolant flow path 16, to heat exchanger 20. Within heat exchanger 20, the waste heat is conducted to a second cooling fluid flowing in second coolant flow path 22, reducing the temperature of the first cooling fluid in first coolant flow path 16. The second cooling fluid is, for example, helium, air, water, a glycol/ water mixture or a fluid used elsewhere that may benefit from receiving the waste heat, for example, fuel for a gas turbine engine. First coolant flow path 16 directs the first cooling fluid back to electrical generator 12, forming a continuous circuit to remove waste heat from electrical generator 12.

Figure 2A:
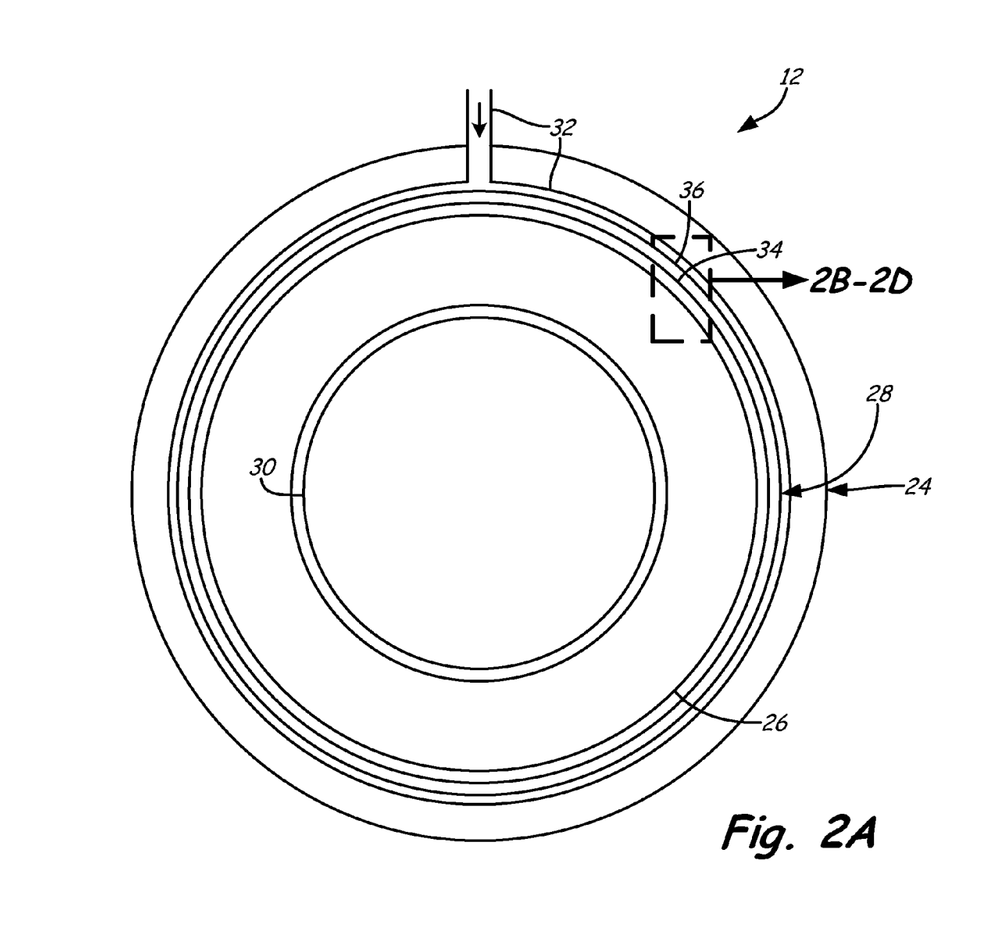
FIGS. 2A-2D are cross-sections of the electrical generator of FIG. 1.

The embodiment of the present invention for thermoelectric conversion of waste heat shown in FIG. 1 includes thermoelectric elements positioned within the electrical generator 12 as described below in detail in reference to FIGS. 2A-2D. FIGS. 2A-2D are cross-sectional views of electrical generator 12 of FIG. 1. As illustrated in FIG. 2A, electrical generator 12 includes stator housing 24, stator core 26, stator sleeve assembly 28, and rotor 30. Stator housing 24 includes at least one coolant channel 32. Stator sleeve assembly includes stator sleeve 34 and a plurality of electrical generator thermoelectric elements (EGTE) 36. EGTE 36 is any type of thermoelectric device that employs the Seebeck effect to generate electrical power as a function of a temperature difference between opposite sides of the thermoelectric device. A thermoelectric device has a relatively low thermal conductivity between opposite sides to help maintain the temperature difference between opposite sides to improve the efficiency of the thermoelectric device. Such devices are typically alternating pairs of n-type and p-type semiconductors such as, for example lead telluride, bismuth telluride, or skutterudites; which may be constructed in nano-scale layers (nanomaterials). The plurality of EGTE 36 are electrically connected in series (not shown). Connecting the alternating pairs in series produces a useful voltage level. Stator core 26 contains stator windings (not shown) forming the armature of the stator.

Figure 2B:
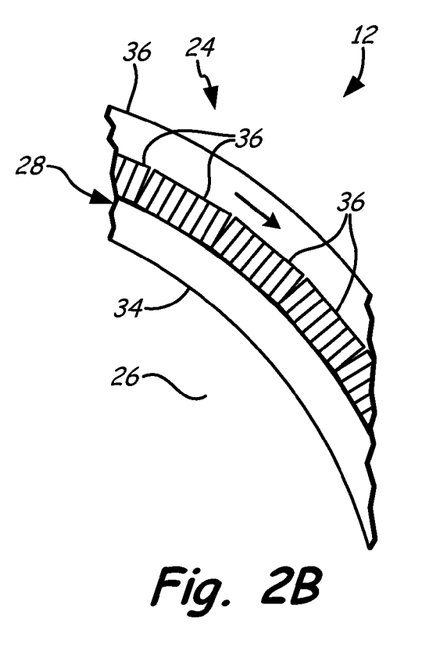

As shown in FIG. 1, shaft 14 is connected to electrical generator 12. This connection is to rotor 30. As shown in FIG. 2A, stator core 26 is disposed axially around rotor 30 with a small gap separating rotor 30 from stator core 26. Stator sleeve assembly 28 is disposed axially around stator core 26 and is in thermal contact with stator core 26. Stator housing 24 is disposed axially around stator sleeve assembly 28. Cooling channels 32 within stator housing 24 are in thermal contact with stator sleeve assembly 28. Cooling channels 32 are also connected externally to first coolant flow path 16 to complete the circuit of first coolant flow path within electrical generator 12. Thus, cooling channels 32 necessarily also contain the first cooling fluid provided by first coolant flow path 16. Stator sleeve 34 of stator sleeve assembly 28 is cylindrical in shape with a radially inward facing surface and a radially outward facing surface. FIG. 2B provides a more detailed view of a portion of electrical generator 12 shown in FIG. 2A. As shown in FIG. 2B, the radially inward facing surface of stator sleeve 34 is adjacent stator core 26. The plurality of EGTE 36 are affixed to the radially outward facing surface of stator sleeve 34 by any of a number of methods to provide a durable, high thermal conductivity bond between EGTE 36 and stator sleeve 34, without damaging EGTE 36. Such methods include brazing, soldering, application of high temperature adhesive, or mechanical methods (bolts, clamps, etc.) with a thermally conductive material filling any remaining gap between EGTE 36 and stator sleeve 34. EGTE 36 are in thermal contact with cooling channels 32.

In operation, rotation of rotor 30 by shaft 14 within stator core 26 produces waste heat, in addition to generating electrical power by the induction of electric current in the stator windings within stator core 26. The waste heat conducts from the stator windings and stator core 26 to stator sleeve 34, through stator sleeve 34 and across EGTE 36 to the first cooling fluid flowing through cooling channels 32 within stator housing 24. The first cooling fluid flows out of electrical generator 12 into first coolant flow path 16 and is cooled and returned to electrical generator 12 as described above in reference to FIG. 1. The continuous conduction of waste heat from stator core 26 to cooling channels 32 provides EGTE 36 with a temperature difference between opposite sides of EGTE 36, resulting in the generation of useful electrical power from the waste heat.

Figure 2C:
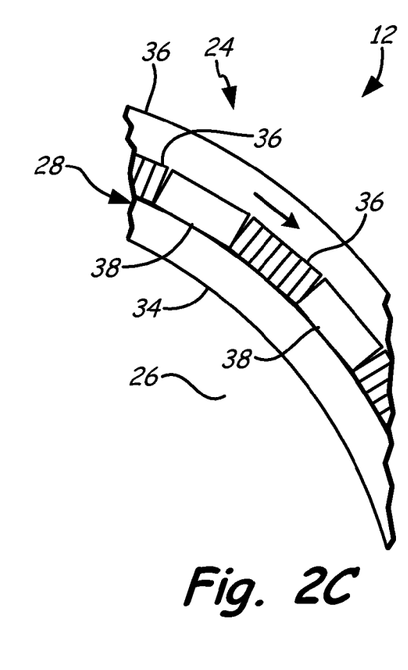
Figure 2D:
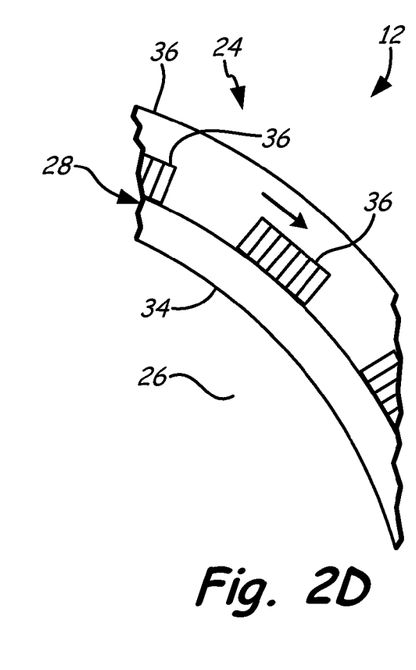

In the embodiment illustrated in FIG. 2B, the plurality of EGTE 36 are continuous along the radially outward facing surface of stator sleeve 34. While this embodiment provides the maximum power generation from waste heat, it reduces the effectiveness of the removal of waste heat from electrical generator 12 by the first cooling fluid flowing in cooling channels 32. This is because, as noted above, EGTE 36 typically has a relatively low thermal conductivity between opposite sides to help maintain the temperature difference between opposite sides, reducing the rate at which waste heat is removed from stator core 26. In some applications, such a reduction in the removal rate of waste heat may result in damage to electrical generator 12. The embodiments of FIGS. 2C and 2D illustrate two approaches for arranging EGTE 36 to alleviate this problem. The embodiment of FIG. 2C includes a plurality of electrical generator thermally conductive elements (EGTC) 38. EGTC 38 are made of a relatively high thermal conductivity material, for example, copper or aluminum. As shown in FIG. 2C, the plurality of EGTC 38 are also affixed to the radially outward facing surface of stator sleeve 34, interspersed with the plurality of EGTE 36. Alternatively, EGTC 38 may be raised areas of stator sleeve 34. By replacing some of the plurality of EGTE 36 with EGTC 38, the effectiveness of the removal of waste heat from electrical generator 12 is improved over the embodiment of FIG. 2B. The embodiment of FIG. 2D intersperses gaps between the plurality of EGTE 36. Here again, by eliminating some of the plurality of EGTE 36, the effectiveness of the removal of waste heat from electrical generator 12 is also improved over the embodiment of FIG. 2B. Although it is to be noted that the embodiments shown in FIGS. 2C-2D provide less power generation from waste heat compared to the embodiment of FIG. 2B.

Figure 3A:
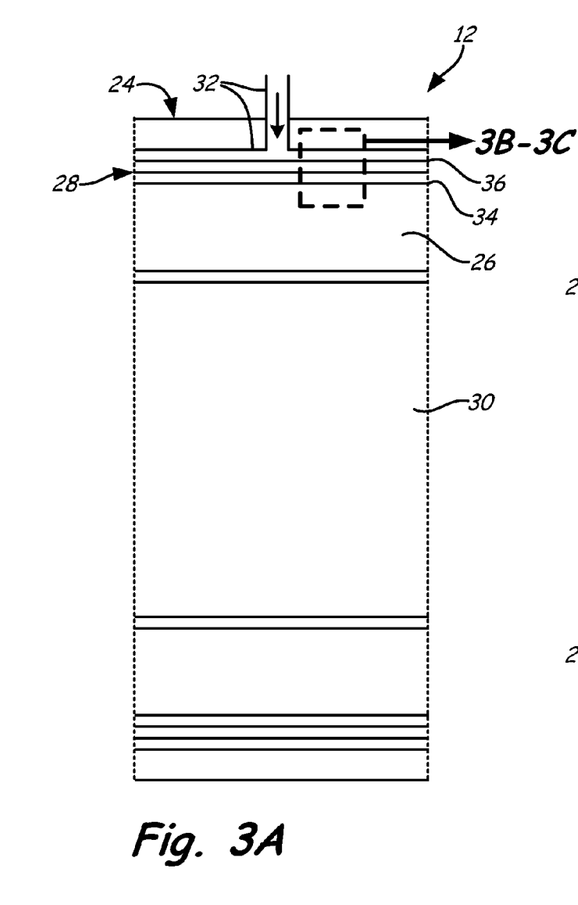
FIGS. 3A-3C are longitudinal sections of the electrical generator of FIG. 1
Figure 3B:
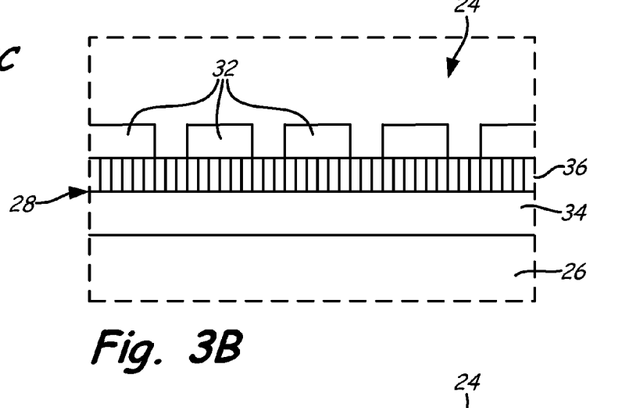
Figure 3C:
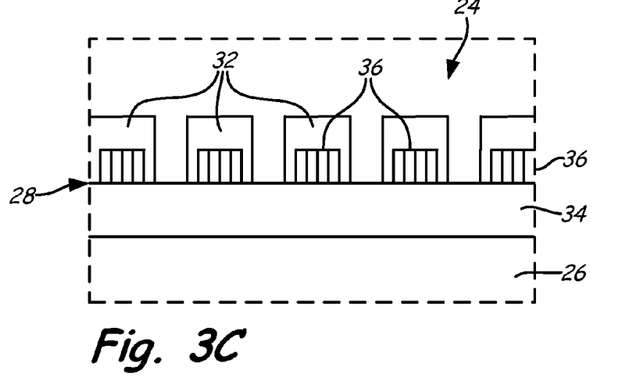

FIGS. 3A-3C provide additional details about the embodiment of the present invention for thermoelectric conversion of waste heat shown in FIG. 1. FIGS. 3A-3C are longitudinal sectional views of electrical generator 12 to complement the details shown in the cross-sectional vies of FIGS. 2A-2D. FIGS. 3A-3C illustrate every element described in reference to FIG. 2A above, from a longitudinal sectional view ninety degrees from the cross-sectional view of FIG. 2A. FIG. 3B provides a more detailed view of a portion of electrical generator 12 shown in FIG. 3A. As shown in FIG. 3B, coolant channels 32 are recessed into stator housing 24 resulting in regions of stator housing 24 separating coolant channels 32. As shown in the embodiment of FIG. 3B, the regions of stator housing 24 separating coolant channels 32 are immediately adjacent the plurality of EGTE 36 that are continuous along the radially outward facing surface of stator sleeve 34 in a longitudinal direction. FIG. 3C illustrates an alternative embodiment in which gaps separate the plurality of EGTE 36 in the longitudinal direction and the regions of stator housing 24 separating coolant channels 32 are immediately adjacent the radially outward facing surface of stator sleeve 34 in the gaps separating the plurality of EGTE 36. Depending on the method of manufacture and assembly of electric generator 12 and the radial stresses involved, either embodiment may be effectively employed.

For example, the embodiment of FIG. 3B is relatively easy to install, with little alignment tolerance required, however, any compressive stress between stator sleeve assembly 28 and stator housing 24 may damage EGTE 36. Conversely, with the embodiment of FIG. 3C, EGTE 36 are not exposed to any compressive stress between stator sleeve assembly 28 and stator housing 24, but alignment of stator sleeve assembly 28 is more difficult. The regions of stator housing 24 separating coolant channels 32 must be aligned with the gaps separating the plurality of EGTE 36.

Figure 4A:
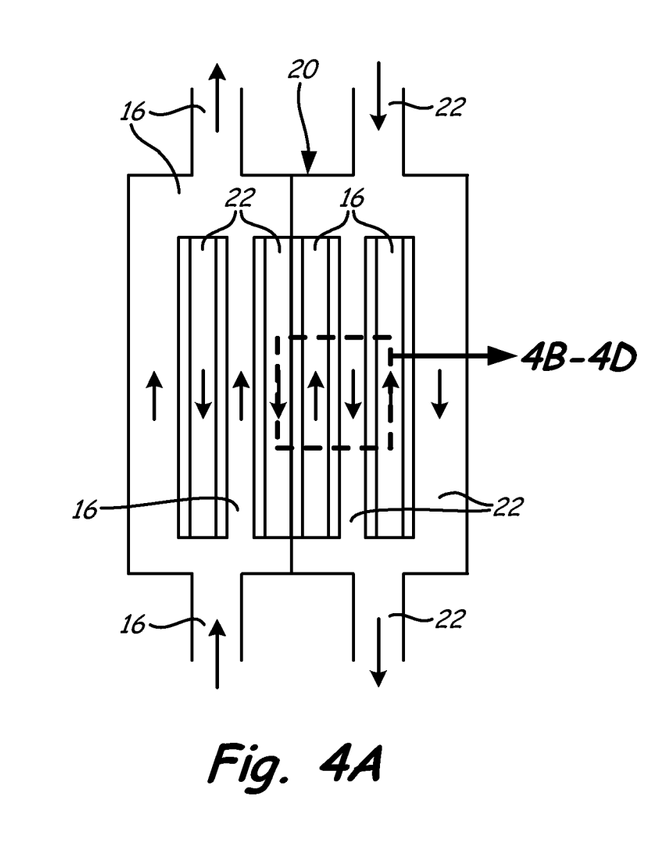
FIGS. 4A-4D are longitudinal sections of a portion of the external cooling system of FIG. 1
Figure 4B:
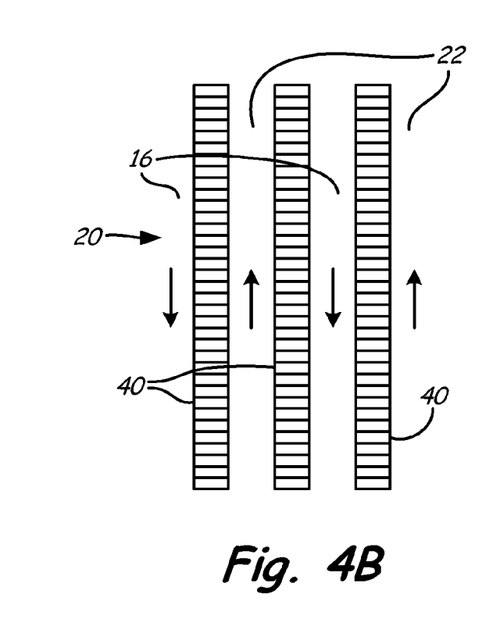

In another embodiment of the present invention, a second set of thermoelectric elements is employed within heat exchanger 20 between first coolant flow path 16 and second coolant flow path 22. Additional useful electrical power is generated by the temperature difference between cooling fluids in the two flow paths. FIGS. 4A-4D are longitudinal sections of a portion of the external cooling system of FIG. 1 illustrating such an embodiment. As illustrated in FIG. 4A, heat exchanger 20 includes multiple counter-current flow paths of first coolant flow path 16 carrying the first cooling fluid from electrical generator 12 interspersed with second coolant flow path 22 carrying the second cooling fluid. The multiple flow paths within heat exchanger 20 provide a relatively high surface area for heat transfer between the separate flow paths. FIG. 4B illustrates a more detailed view of a section of the heat exchanger 20. The embodiment of FIG. 4B includes a plurality of heat exchanger thermoelectric elements (HETE) 40 positioned between first coolant flow path 16 and second coolant flow path 22 for each of the interspersed flow paths. HETE 40 is any type of thermoelectric device that employs the Seebeck effect as described above. The plurality of HETE 40 are electrically connected in series (not shown). Connecting the alternating pairs in series produces a useful voltage level.

In operation, the first cooling fluid containing the waste heat out of electrical generator 12 enters heat exchanger 20 through first coolant flow path 16. Within heat exchanger 20, waste heat is conducted from the first cooling fluid in each of the multiple first coolant flow paths 16 across the plurality of HETE 40 to each of the second coolant flow paths 22 and into the second cooling fluid, reducing the temperature of the first cooling fluid in first coolant flow path 16. First coolant flow path 16 directs the first cooling fluid back to electrical generator 12. Second coolant flow path 22 directs the second cooling fluid away from heat exchanger 20. The continuous conduction of waste heat from first coolant flow path 16 to second coolant flow path 22 provides HETE 40 with a temperature difference between opposite sides of HETE 40, resulting in the generation of useful electrical power from the waste heat. The second set of thermoelectric elements, HETE 40, within heat exchanger 20 complements the first set of thermoelectric elements, EGTE 36, of stator sleeve assembly 28 to convert waste heat from electrical generator 12 into useful electrical power.

Figure 4C:
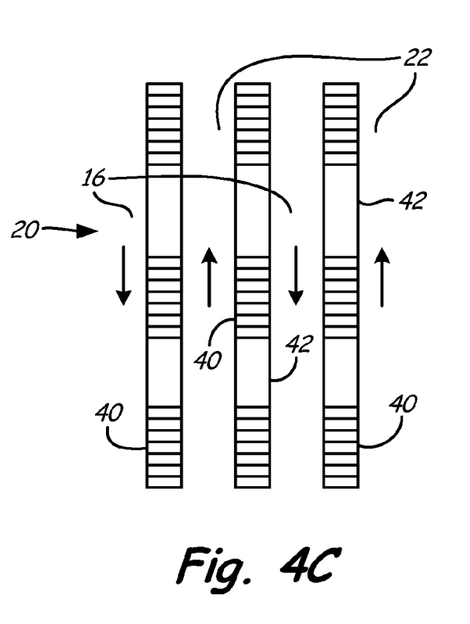
Figure 4D:
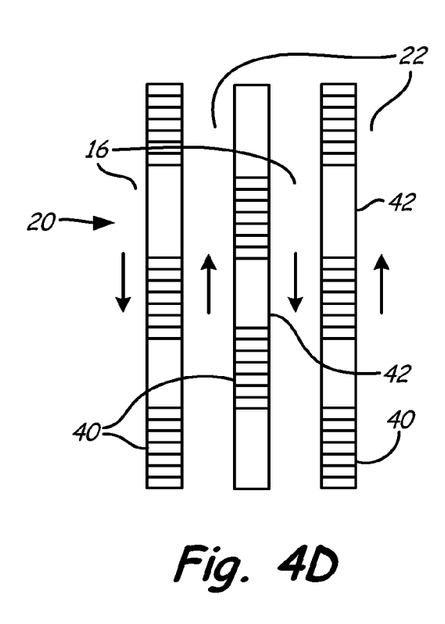

In the embodiment illustrated in FIG. 4B, the plurality of HETE 40 are continuous between first coolant flow path 16 and second coolant flow path 22 within heat exchanger 20. While this embodiment provides the maximum power generation from waste heat, it reduces the effectiveness of heat exchanger 20 in removing waste heat from first coolant flow path 16. This is because, as noted above, thermoelectric devices typically have a relatively low thermal conductivity between opposite sides to help maintain the temperature difference between opposite sides. This reduces the rate at which waste heat is removed from first coolant flow path 16, which may require a larger, more expensive heat exchanger 20 with a larger surface area. The embodiments of FIGS. 4C-4D illustrate two approaches for arranging HETE 40 to alleviate this problem. The embodiments of FIGS. 4C-4D include a plurality of heat exchanger thermally conductive elements (HETC) 42. HETC 42 are made of a relatively high thermal conductivity material, for example, copper or aluminum. As shown in FIGS. 4C-4D, the plurality of HETC 42 are interspersed with the plurality of HETE 40 positioned between first coolant flow path 16 and second coolant flow path 22 for each of the interspersed flow paths. HETC 42 may be interspersed in a line, as illustrated in FIG. 4C, or interspersed in a staggered fashion, as illustrated in FIG. 4D. By replacing some of the plurality of HETE 40 with HETC 42, the effectiveness of the removal of waste heat from first coolant flow path 16 is improved over the embodiment of FIG. 4B. Although it is to be noted that the embodiments shown in FIGS. 4C-4D provide less power generation from waste heat compared to the embodiment of FIG. 4B.

The present invention is an electrical generator cooling system that employs thermoelectric devices to convert waste heat to useful electrical power. The electrical generator features a stator sleeve assembly that includes thermoelectric elements affixed to the outer surface of a stator sleeve. The thermoelectric elements generate useful electrical power from the conduction of waste heat from the stator core, through the stator sleeve. Positioning the thermoelectric elements on the outer surface of the stator sleeve provides the thermoelectric elements with one of the largest temperature differences available in the generator cooling system, resulting in more effective conversion of waste heat to useful electrical power.

In some embodiments, additional useful electrical power may be generated by a second set of thermoelectric elements within a heat exchanger in the electrical generator cooling system. The second set of thermoelectric elements within the heat exchanger complements the thermoelectric elements of the stator sleeve assembly to convert waste heat from the electrical generator into useful electrical power.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electrical generator comprising:
   a rotor;
   a stator core disposed axially around the rotor;
   a stator sleeve assembly disposed axially around the stator core, and in thermal contact with the stator core, the stator sleeve assembly comprising:
      a cylindrical stator sleeve having a radially inward facing surface and a radially outward facing surface; and
      a plurality of first thermoelectric elements affixed to the radially outward facing surface of the cylindrical stator sleeve; and
   a stator housing disposed axially around the stator sleeve assembly, the stator housing comprising at least one coolant channel configured to contain a cooling fluid;
   wherein the at least one coolant channel is in thermal contact with the plurality of first thermoelectric elements and the plurality of first thermoelectric elements generate power as a function of the temperature difference between the cylindrical stator sleeve and the cooling fluid contained within the at least one coolant channel.

2. The electrical generator of claim 1, wherein the plurality of first thermoelectric elements are electrically connected in series.

3. The electrical generator of claim 1, wherein the plurality of first thermoelectric elements form a continuous layer.

4. The electrical generator of claim 1, wherein at least a portion of the plurality of first thermoelectric elements are separated from each other by a gap.

5. The electrical generator of claim 1, wherein the stator sleeve assembly further comprises:
 a plurality of thermally conductive elements affixed to the radially outward facing surface of the cylindrical stator sleeve;
 wherein the plurality of first thermoelectric elements and the plurality of thermally conductive elements alternate across the radially outward facing surface of the cylindrical stator sleeve to form a continuous layer.

6. The electrical generator of claim 1, further comprising:
 a heat exchanger, the heat exchanger comprising:
 a first coolant flow path;
 a second coolant flow path in thermal contact with the first coolant flow path; and
 a plurality of second thermoelectric elements between the first coolant flow path and the second coolant flow path; the plurality of second thermoelectric elements in thermal contact with the first coolant flow path and the second coolant flow path to generate power as a function of the temperature difference between the first coolant flow path and the second coolant flow path; and
 a pump connected to the stator housing and to the heat exchanger to move the cooling fluid through the at least one coolant channel, through the first coolant flow path, and back through the at least one coolant channel in a continuous circuit.

7. The electrical generator of claim 6, wherein the first and second coolant flow paths through the heat exchanger are in opposite directions.

8. The electrical generator of claim 6, wherein the plurality of second thermoelectric elements form a continuous layer between the first coolant flow path and the second coolant flow path.

9. The electrical generator of claim 6, wherein at least a portion of the plurality of first thermoelectric elements are separated from each other by a gap.

10. The electrical generator of claim 6, wherein the heat exchanger further comprises:
 a plurality of thermally conductive elements between the first coolant flow path and the second coolant flow path;
 wherein the plurality of second thermoelectric elements and the plurality of thermally conductive elements alternate to form a continuous layer between the first coolant flow path and the second coolant flow path.

11. The electrical generator of claim 6, wherein the first coolant flow path contains oil.

12. The electrical generator of claim 11, wherein the second coolant flow path contains fuel.

* * * * *